United States Patent
Weng et al.

(10) Patent No.: US 12,494,757 B2
(45) Date of Patent: *Dec. 9, 2025

(54) STRUCTURE AND MANUFACTURING METHOD OF SURFACE ACOUSTIC WAVE FILTER WITH INTERDIGITAL TRANSDUCER

(71) Applicant: Shenzhen Newsonic Technologies Co., Ltd., Shenzhen (CN)

(72) Inventors: Guojun Weng, Shenzhen (CN); Gongbin Tang, Shenzhen (CN)

(73) Assignee: Shenzhen Newsonic Technology Co., Ltd., Shenzhen (CN)

( * ) Notice: Subject to any disclaimer, the term of this patent is extended or adjusted under 35 U.S.C. 154(b) by 603 days.

This patent is subject to a terminal disclaimer.

(21) Appl. No.: 17/933,077

(22) Filed: Sep. 16, 2022

(65) Prior Publication Data

US 2023/0009638 A1  Jan. 12, 2023

(51) Int. Cl.
  *H03H 3/08* (2006.01)
  *H03H 9/02* (2006.01)
  *H03H 9/64* (2006.01)

(52) U.S. Cl.
  CPC .......... *H03H 3/08* (2013.01); *H03H 9/02559* (2013.01); *H03H 9/02574* (2013.01); *H03H 9/64* (2013.01)

(58) Field of Classification Search
  CPC .. H03H 3/08; H03H 9/02559; H03H 9/02574; H03H 9/64; H03H 9/0552
  See application file for complete search history.

(56) References Cited

U.S. PATENT DOCUMENTS

2010/0277037 A1\* 11/2010 Fukano ................ H03H 9/1092
  29/25.35
2011/0266918 A1\* 11/2011 Iwamoto .................. H03H 3/08
  29/25.35

(Continued)

FOREIGN PATENT DOCUMENTS

CN   114884482 A   8/2022

OTHER PUBLICATIONS

International Search Report and Written Opinion issued by the International Searching Authority on Dec. 11, 2023, in counterpart International Application No. PCT/IB/2023/059160.

(Continued)

*Primary Examiner* — Jeffrey T Carley
*Assistant Examiner* — Jose K Abraham
(74) *Attorney, Agent, or Firm* — Finnegan, Henderson, Farabow, Garrett & Dunner LLP.

(57) ABSTRACT

A fabrication method of a surface acoustic wave (SAW) filter includes obtaining a piezoelectric substrate, forming a first interdigital transducer (IDT) on a first portion of the piezoelectric substrate, forming a first pad metal layer on the first IDT, forming a first dielectric layer on the first portion of the piezoelectric substrate, covering the first IDT and the first pad metal layer, forming a trench in the first dielectric layer, forming a second dielectric layer on the first dielectric layer, forming a third dielectric layer on the second dielectric layer, removing a second portion of the piezoelectric substrate to obtain a piezoelectric layer, forming a second IDT on the piezoelectric layer, and etching and releasing a portion of the first dielectric layer surrounded by the trench to form a cavity.

8 Claims, 21 Drawing Sheets

(56) References Cited

U.S. PATENT DOCUMENTS

| | | | |
|---|---|---|---|
| 2012/0205754 A1* | 8/2012 | Iwamoto | H03H 3/02 257/E21.001 |
| 2013/0187246 A1* | 7/2013 | Adkisson | H01L 24/05 438/51 |
| 2013/0321100 A1 | 12/2013 | Wang | |
| 2016/0182009 A1* | 6/2016 | Bhattacharjee | H03H 9/02574 310/313 R |
| 2019/0074813 A1* | 3/2019 | Zou | H03H 9/562 |
| 2020/0395915 A1 | 12/2020 | Giner De Haro et al. | |
| 2022/0103147 A1* | 3/2022 | Wang | H03H 9/02574 |

OTHER PUBLICATIONS

Ji Liang et al., "Design and fabrication of aluminum nitride Lamb wave resonators towards high figure of merit for intermediate frequency filter applications", Journal of Micromechanics and Microengineering, Institute of Physics Publishing, Bristol, GB, vo. 25, No. 3, Feb. 11, 2015.

* cited by examiner

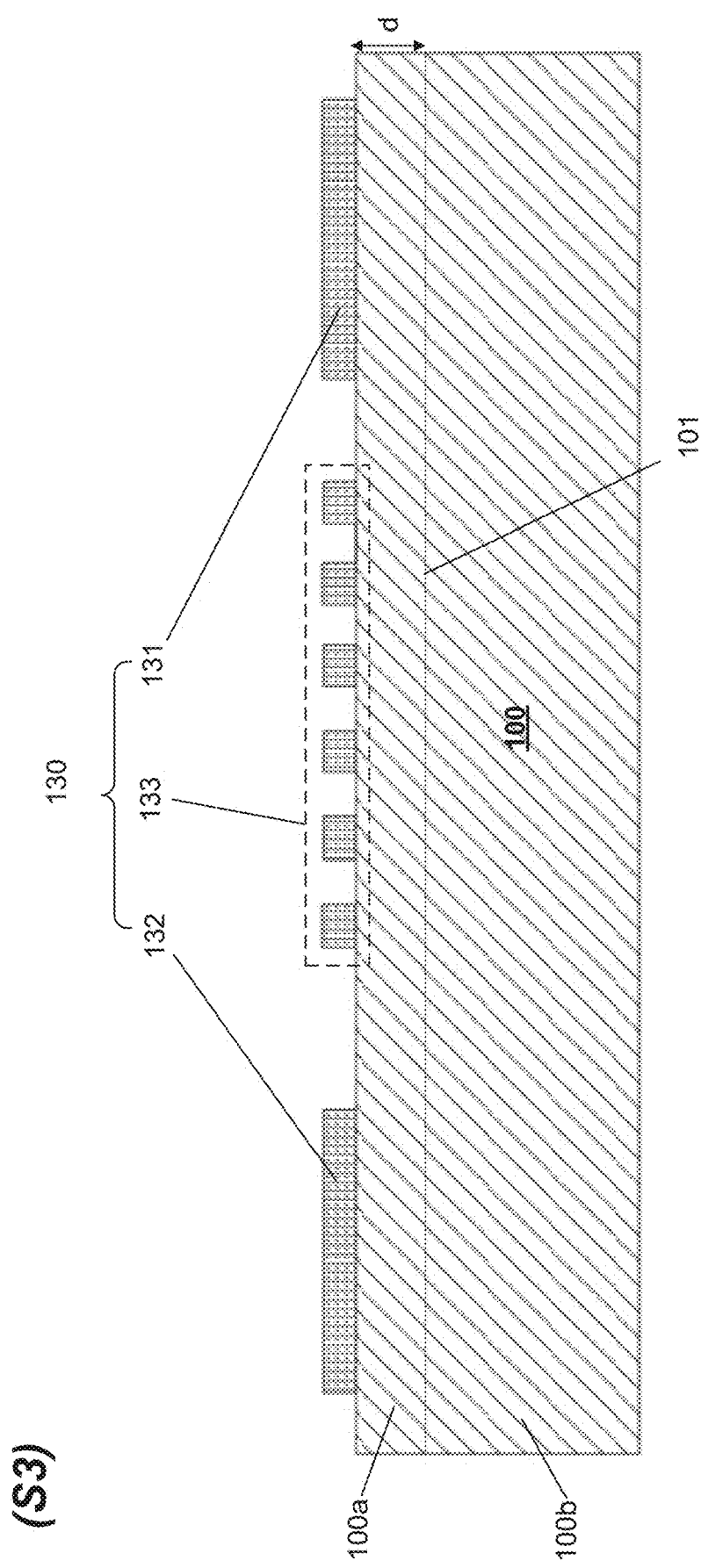

STRUCTURE AND MANUFACTURING METHOD OF SURFACE ACOUSTIC WAVE FILTER WITH INTERDIGITAL TRANSDUCER

FIELD OF THE DISCLOSURE

The present disclosure relates to the field of semiconductor devices and, in particular, to a surface acoustic wave (SAW) filter structure and a method of fabricating the SAW filter.

BACKGROUND

Surface acoustic wave (SAW) devices, such as SAW resonators and SAW filters, are used in many applications such as radio frequency (RF) filters. A typical SAW filter includes a plurality of interdigital transducers (IDTs) formed on a piezoelectric substrate. The plurality of IDTs are connected in series or in parallel.

As the use of SAW filters in modern RF communication systems increase, there is a need for SAW filters with improved quality factor (Q).

SUMMARY

According to one aspect of the disclosure, a surface acoustic wave (SAW) filter is provided. The SAW filter includes a bottom substrate, a piezoelectric layer disposed above the bottom substrate and having a bottom surface facing the bottom substrate and a top surface opposite to the bottom surface, a cavity disposed below the piezoelectric layer, a first interdigital transducer (IDT) disposed on the bottom surface of the piezoelectric layer, and a second IDT disposed on the top surface of the piezoelectric layer. An interdigital portion of the first IDT is exposed in the cavity. An interdigital portion of the second IDT is vertically aligned with the interdigital portion of the first IDT.

According to one aspect of the disclosure, a fabrication method of a surface acoustic wave (SAW) filter is provided. The method includes: obtaining a piezoelectric substrate, forming a first interdigital transducer (IDT) on a first portion of the piezoelectric substrate, forming a first pad metal layer on the first IDT, a first section of the first pad metal layer being formed on a first input and output end of the first IDT, and a second section of the first pad metal layer being formed on a second input and output end of the first IDT, forming a first dielectric layer on the first portion of the piezoelectric substrate, covering the first IDT and the first pad metal layer, forming a trench in the first dielectric layer and exposing a portion of the first portion of the piezoelectric substrate, the trench surrounding a portion of the first dielectric layer that covers an interdigital portion of the first IDT, forming a second dielectric layer on the first dielectric layer and covering sidewalls and a bottom of the trench, forming a third dielectric layer on the second dielectric layer, the third dielectric layer filling in the trench, bonding a bottom substrate to the third dielectric layer, removing a second portion of the piezoelectric substrate, and leaving the first portion of the piezoelectric substrate, the first portion of the piezoelectric substrate constituting a piezoelectric layer, forming a second IDT on the piezoelectric layer, and etching and releasing the portion of the first dielectric layer surrounded by the trench to form a cavity below the interdigital portion of the first IDT via the release hole formed in the piezoelectric layer.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1A:
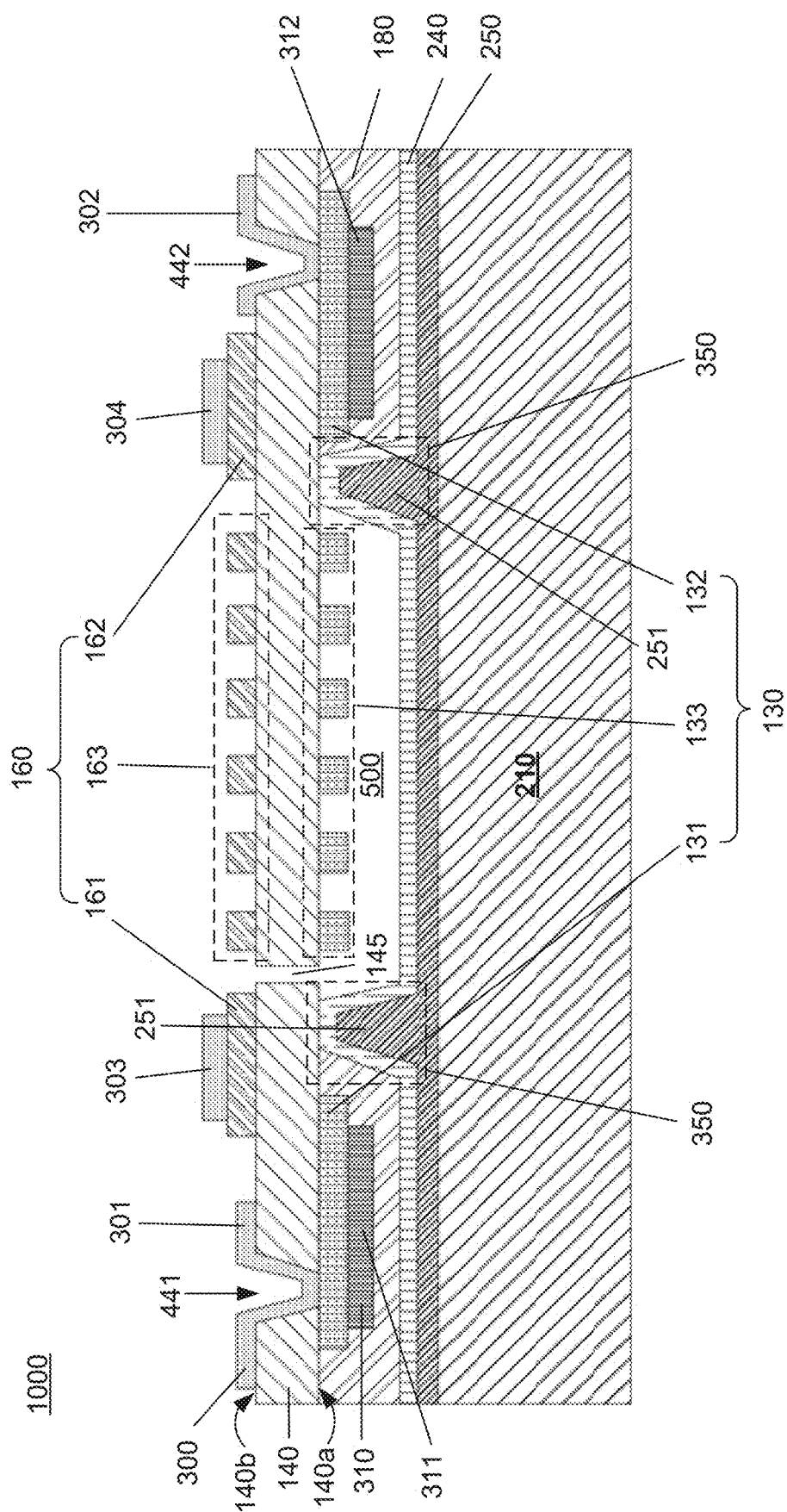
FIG. 1A is a cross-sectional view of a SAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Figure 1B:
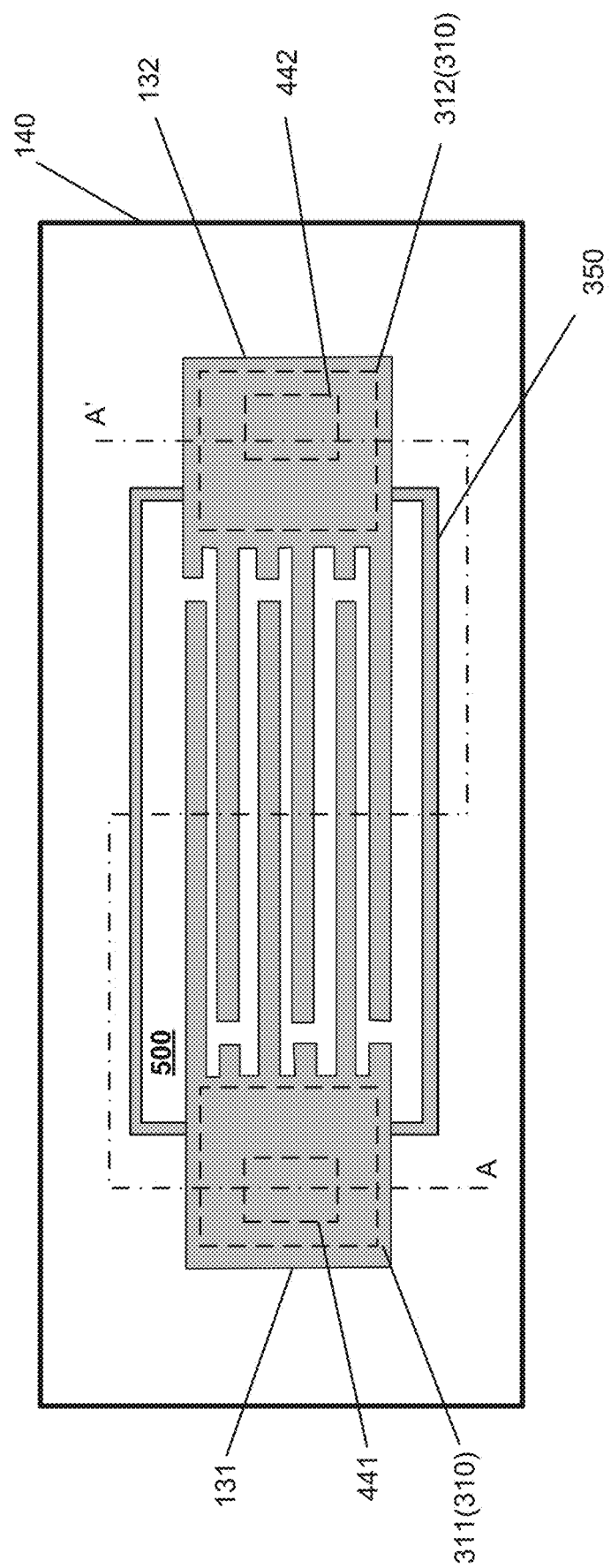
FIG. 1B is a top view showing selected portions of the SAW filter of FIG. 1A, according to an embodiment of the present disclosure.
Figure 1C:
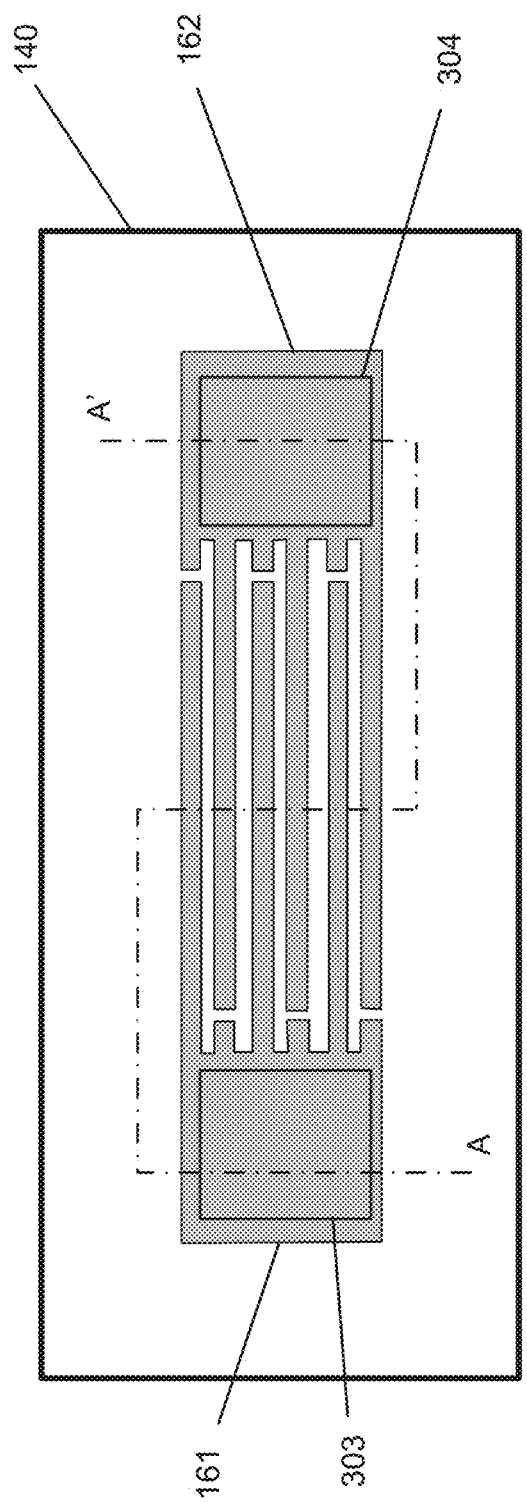
FIG. 1C is a top view showing other selected portions of the SAW filter of FIG. 1A, according to an embodiment of the present disclosure.

FIG. 1A is a cross-sectional view of a SAW filter 1000, according to an embodiment of the present disclosure. FIG. 1B is a top view showing selected portions of SAW filter 1000, according to an embodiment of the present disclosure. A cross section of the selected portions in FIG. 1B along line A-A' is illustrated in FIG. 1A. FIG. 1C is a top view showing other selected portions of SAW filter 1000, according to an embodiment of the present disclosure. A cross section of the selected portions in FIG. 1C along line A-A is illustrated in FIG. 1A. As illustrated in FIGS. 1A, 1B, and 1C, SAW filter 1000 includes a bottom substrate 210, a piezoelectric layer 140 disposed above bottom substrate 210 and having a bottom surface 140a facing bottom substrate 210 and a top surface 140b parallel with and opposite to bottom surface 140a, a cavity 500 disposed below piezoelectric layer 140, a first interdigital transducer (IDT) 130 disposed on bottom surface 140a of piezoelectric layer 140, and a second IDT 160 disposed on the top surface 140b of piezoelectric layer 140.

Figure 1D:
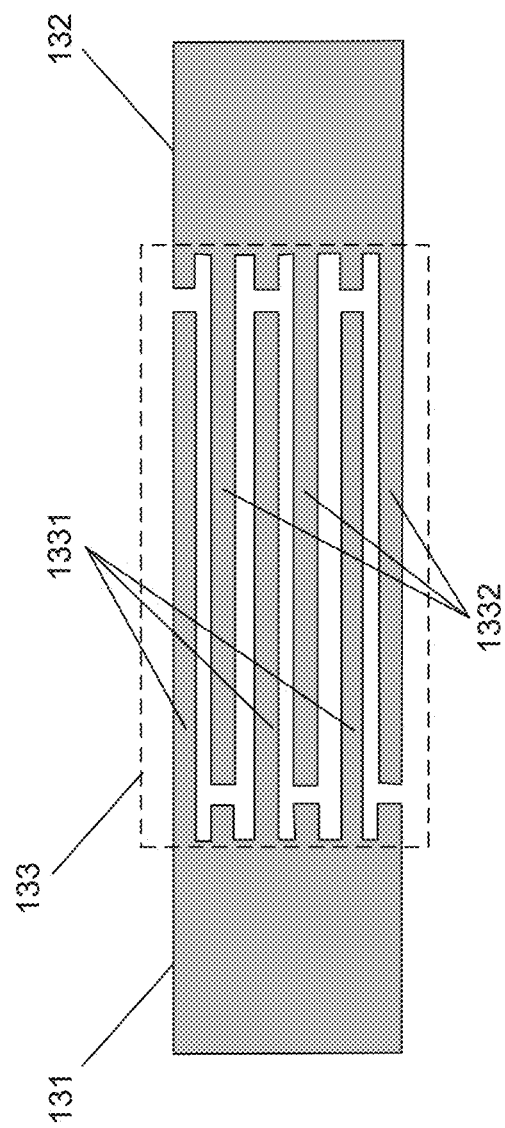
FIG. 1D is a top view of an interdigital transducer (IDT), according to an embodiment of the present disclosure.

FIG. 1D is a top view of IDT 130, according to an embodiment of the present disclosure. As illustrated in FIG. 1D, first IDT 130 includes a first input and output end 131, a second input and output end 132, and an interdigital portion 133. Interdigital portion 133 includes a first set of electrode fingers 1331 coupled to first input and output end 131, and a second set of electrode fingers 1332 coupled to second input and output end 132. The second set of electrode fingers 1332 are interleaved with and parallel to the first set of electrode fingers 1331. Interdigital portion 133 of first IDT 130 is exposed in cavity 500.

Similar to IDT 130, second IDT 160 includes a first input and output end 161, a second input and output end 162, and an interdigital portion 163. Interdigital portion 163 includes a first set of electrode fingers coupled to first input and output end 161, and a second set of electrode fingers coupled to second input and output end 162. The second set of electrode fingers are interleaved with and parallel to the first set of electrode fingers. Interdigital portion 163 of second IDT 160 is vertically aligned with interdigital portion 133 of the first IDT 130.

Referring back to FIGS. 1A, 1B, and 1C, a first pad metal layer 310 is disposed below first IDT 130. A first section 311 of first pad metal layer 310 is disposed below and electrically connected with first input and output end 131 of first IDT 130. A second section 312 of first pad metal layer 310 is disposed below and electrically connected with second input and output end 132 of first IDT 130.

A first dielectric layer 180 is disposed between piezoelectric layer 140 and bottom substrate 210, and covers bottom surface 140a of piezoelectric layer 140, first and second input and output ends 131 and 132 of first IDT 130, and first and second sections 311 and 312 of first pad metal layer 310. A second dielectric layer 240 is disposed below first dielectric layer 180 and contacting a portion of bottom surface 140a of piezoelectric layer 140. A third dielectric layer 250 is disposed below second dielectric layer 240, and includes a protruding structure 251 protruding toward piezoelectric layer 140. Protruding structure 251 and the portions of second dielectric layer 240 disposed on sidewalls of protruding structure 251 constitute a double-wall boundary structure 350 that surrounds cavity 500. In other words, piezoelectric layer 140, second dielectric layer 240, and third dielectric layer 250 together enclose cavity 500.

A release hole 145 is formed in piezoelectric layer 140, and connected with cavity 500. Release hole 145 is used for releasing an etchant and etching products of an etching and releasing process for forming cavity 500.

First dielectric layer 180 may be formed of silicon oxide, silicon nitride, or a stacked combination of those materials. Second dielectric layer 240 may be formed of a non-conductive material that cannot be etched by hydrofluoric acid, including, but not limited to, polysilicon, amorphous silicon, AlN, SiN, TaN, GaN, or a stacked combination of two or more of those materials. Third dielectric layer 250 may be formed of silicon oxide, silicon nitride, or a stacked combination of those materials. Bottom substrate 210 may be formed of Si, $SiO_2$, polysilicon, silicon carbide, sapphire ($Al_2O_3$), or a stacked combination of two or more of those materials. Bottom substrate 210 may be bonded to third dielectric layer 250.

A first opening 441 is formed in piezoelectric layer 140 and exposes a portion of first input and output end 131 of IDT 130. A second opening 442 is formed in piezoelectric layer 140 and exposes a portion of second input and output end 132 of IDT 130.

A second pad metal layer 300 is disposed on piezoelectric layer 140. A first section 301 of second pad metal layer 300 is disposed in first opening 441 of piezoelectric layer 140 and electrically connected to first input and output end 131 of first IDT 130 via first opening 441. A second section 302 of second pad metal layer 300 is disposed in second opening 442 of piezoelectric layer 140 and is electrically connected to second input and output end 132 of first IDT 130 via second opening 442. A third section 303 of second pad metal layer 300 is disposed above and electrically connected to first input and output end 161 of second IDT 160. A fourth section 304 of the second pad metal layer 300 is electrically connected to second input and output end 162 of second IDT 160.

Figure 1E:
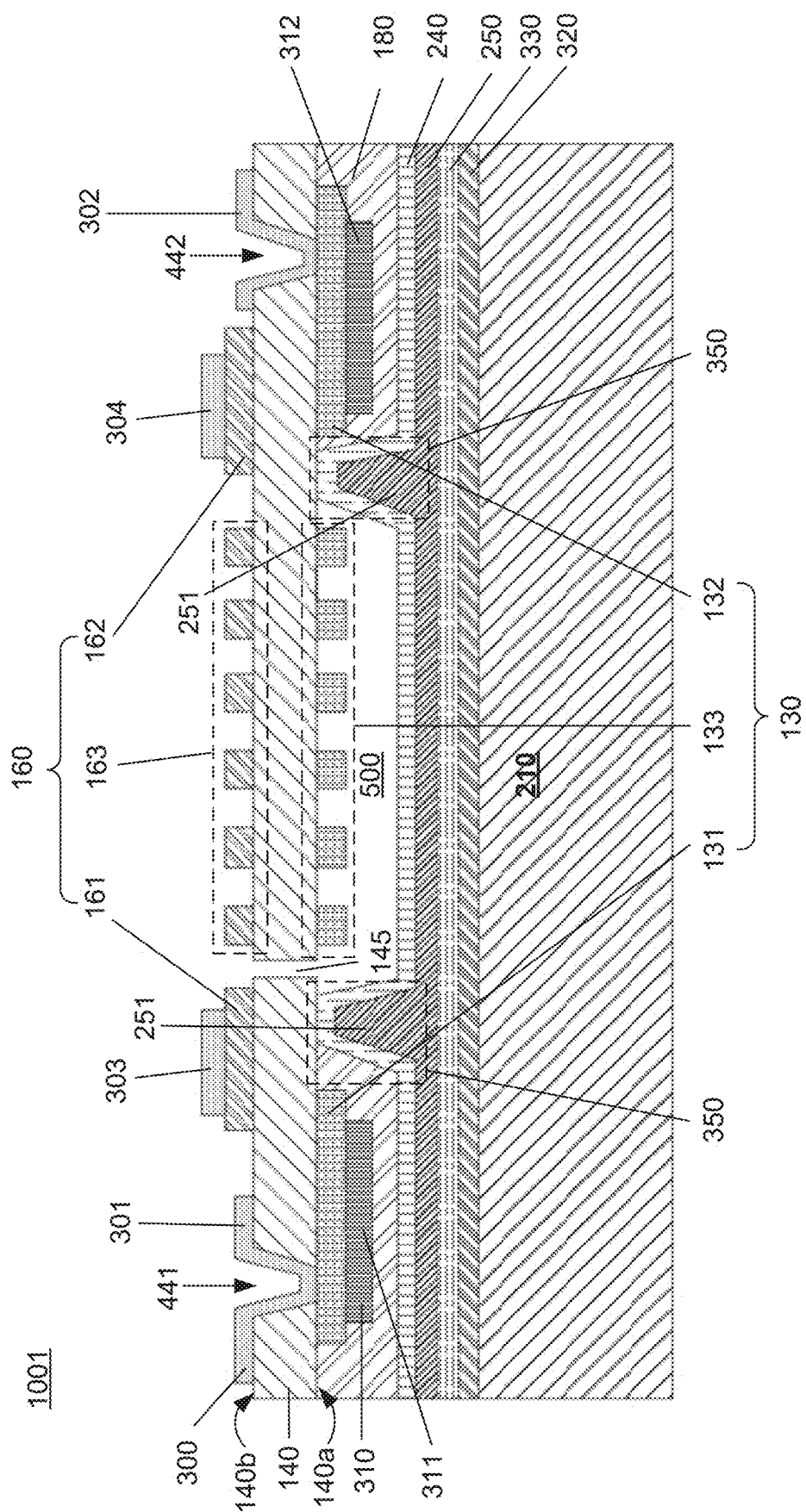
FIG. 1E is a cross-sectional view of a SAW filter, according to an embodiment of the present disclosure.

FIG. 1E is a cross-sectional view of a SAW filter 1001, according to an embodiment of the present disclosure. SAW filter 1001 differs from SAW filter 1000 in that SAW filter 1001 includes a non-conductive layer 320 and a buffer layer 330 disposed between third dielectric layer 250 and bottom substrate 210.

Specifically, non-conductive layer 320 is disposed above bottom substrate 210, and buffer layer 330 disposed above non-conductive layer 320. Non-conductive layer 320 and buffer layer 330 function to make the bonding of bottom substrate 210 easier and to ensure the quality of the bonding, or to improve the performance of SAW filter 1001 by improving a quality factor Q of a SAW resonator. Non-conductive layer 320 may be formed of polysilicon, amorphous silicon, silicon nitride, aluminum nitride, gallium nitride, or a stacked combination of two or more of those materials. Non-conductive layer 320 functions to improve the quality factor Q of the SAW resonator. Buffer layer 330 may be formed of silicon nitride, silicon oxide, or a stacked combination of those materials. Buffer layer 330 functions to create a suitable bonding surface for bottom substrate 210, or to balance a warpage of bottom substrate 210, so that bottom substrate 210 is bonded to third dielectric layer 250 more smoothly.

In some alternative embodiments, a SAW filter may include only one of non-conductive layer 320 and buffer layer 330. For example, a SAW filter may include non-conductive layer 320 disposed between third dielectric layer 250 and bottom substrate 210. Alternatively, a SAW filter may include buffer layer 330 disposed between third dielectric layer 250 and bottom substrate 210.

Except for non-conductive layer 320 and buffer layer 330, the structure and components of SAW filter 1001 are the same as those of SAW filter 1000, and therefore detailed descriptions of the other components of SAW filter 1001 are not repeated.

Figure 2:
FIG. 2 is a flow chart of a process of fabricating the SAW filter of FIG. 1A, according to an embodiment of the present disclosure.
Figure 3A:
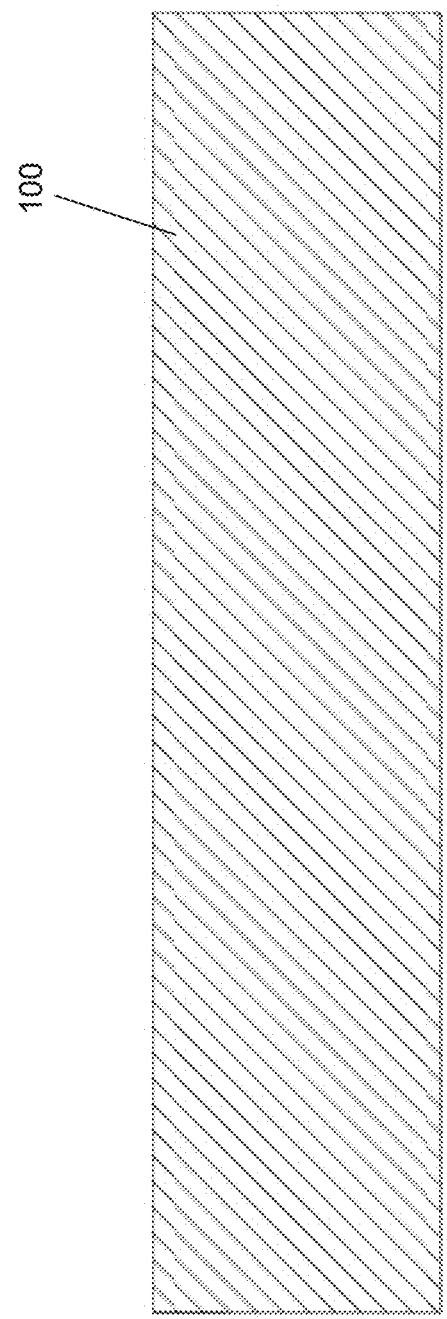
FIGS. 3A-3N are cross-sectional views of structures formed in the process of FIG. 2, according to an embodiment of the present disclosure.

FIG. 2 is a flow chart of a process of fabricating SAW filter 1000, according to an embodiment of the present disclosure. FIGS. 3A-3N are cross-sectional views of structures formed in the process of FIG. 2, according to an embodiment of the present disclosure.

As illustrated in FIG. 3A, in step S1, a piezoelectric substrate 100 is obtained. The piezoelectric substrate may be a lithium niobate or lithium tantalate single crystal substrate.

Figure 3B:
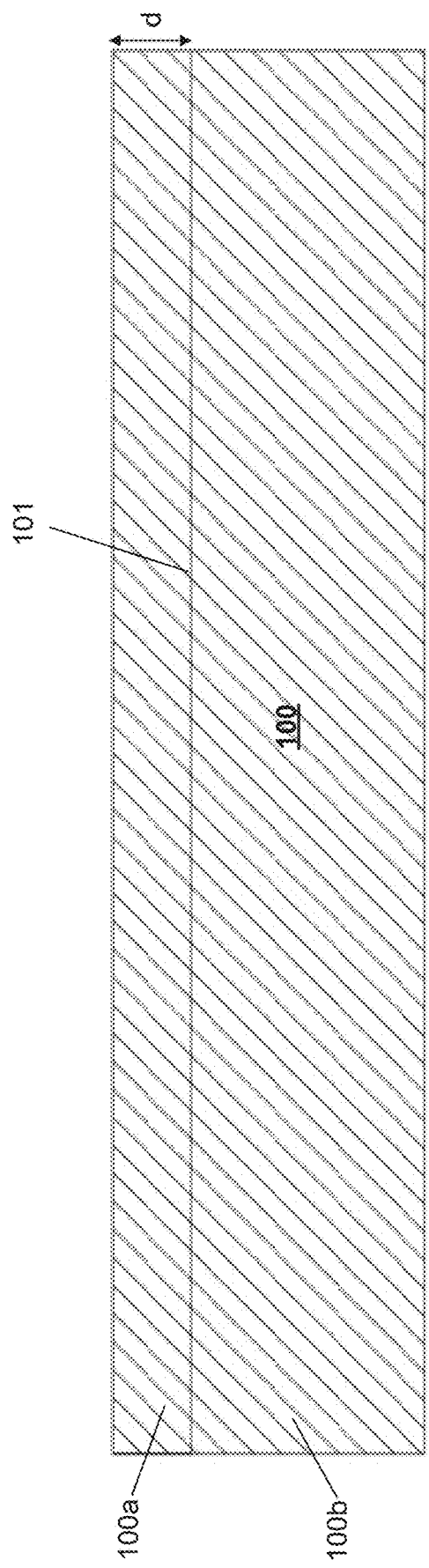

As illustrated in FIG. 3B, in step S2, ions are implanted into piezoelectric substrate 100 at a predetermined implantation depth d, thereby forming an ion layer 101 at depth d of piezoelectric substrate 100. The ions may be helium or hydrogen ions. Implantation depth d may be determined based on a desired thickness of piezoelectric layer 140. For example, implantation depth d may range from approximately 0.3 µm to approximately 10 µm. A first portion 100*a* of piezoelectric substrate 100 is disposed above ion layer 101, and a second portion 100*b* of piezoelectric substrate 100 is disposed below ion layer 101.

As illustrated in FIG. 3C, in step S3, first IDT 130 is formed on first portion 100*a* of piezoelectric substrate 100. First IDT 130 includes first input and output end 131, second input and output end 132, and interdigital portion 133 disposed between first and second input and output ends 131 and 132.

Figure 3D:
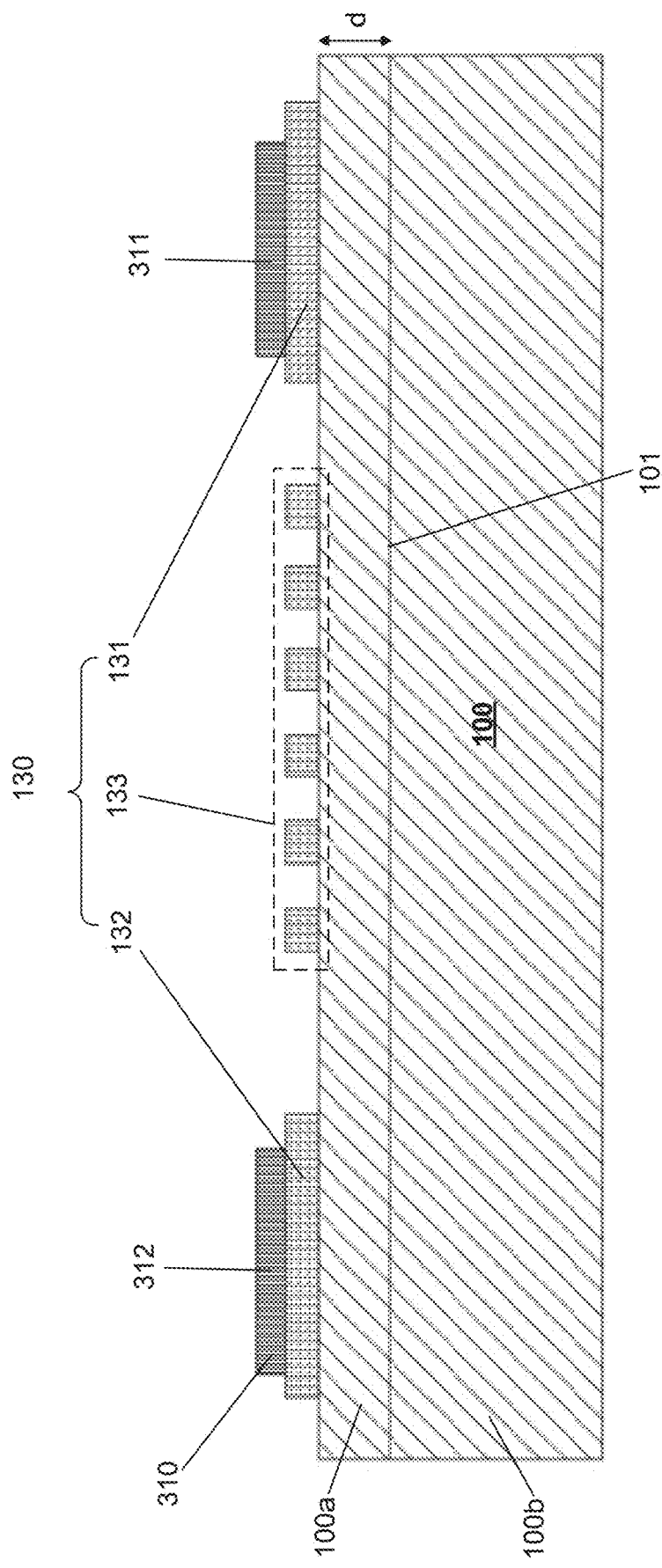

As illustrated in FIG. 3D, in step S4, first pad metal layer 310 is formed on the structure of FIG. 7C. Then, first pad metal layer 310 is patterned to form first section 311 disposed above and electrically connected with first input and output end 131 of first IDT 130, and second section 312 disposed above and electrically connected with second input and output end 132 of first IDT 130.

Figure 3E:
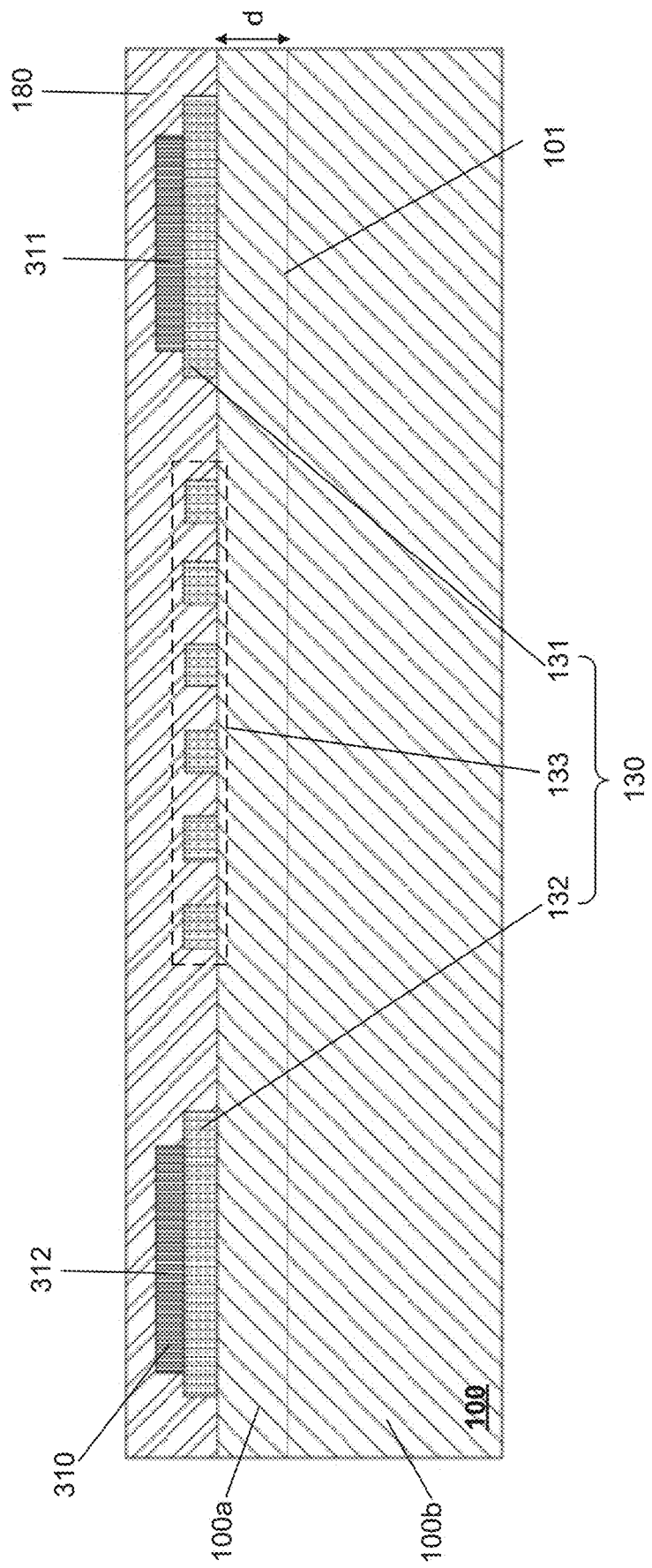

As illustrated in FIG. 3E, in step S5, first dielectric layer 180 is deposited on first portion 100*a* of piezoelectric substrate 100, covering first IDT 130 and first pad metal layer 310. First dielectric layer 180 may include silicon oxide, silicon nitride, or a stacked combination of these materials. First dielectric layer 180 may by deposited by using a physical vapor deposition (PVD) process or a low temperature chemical vapor deposition (CVD) process.

Figure 3F:
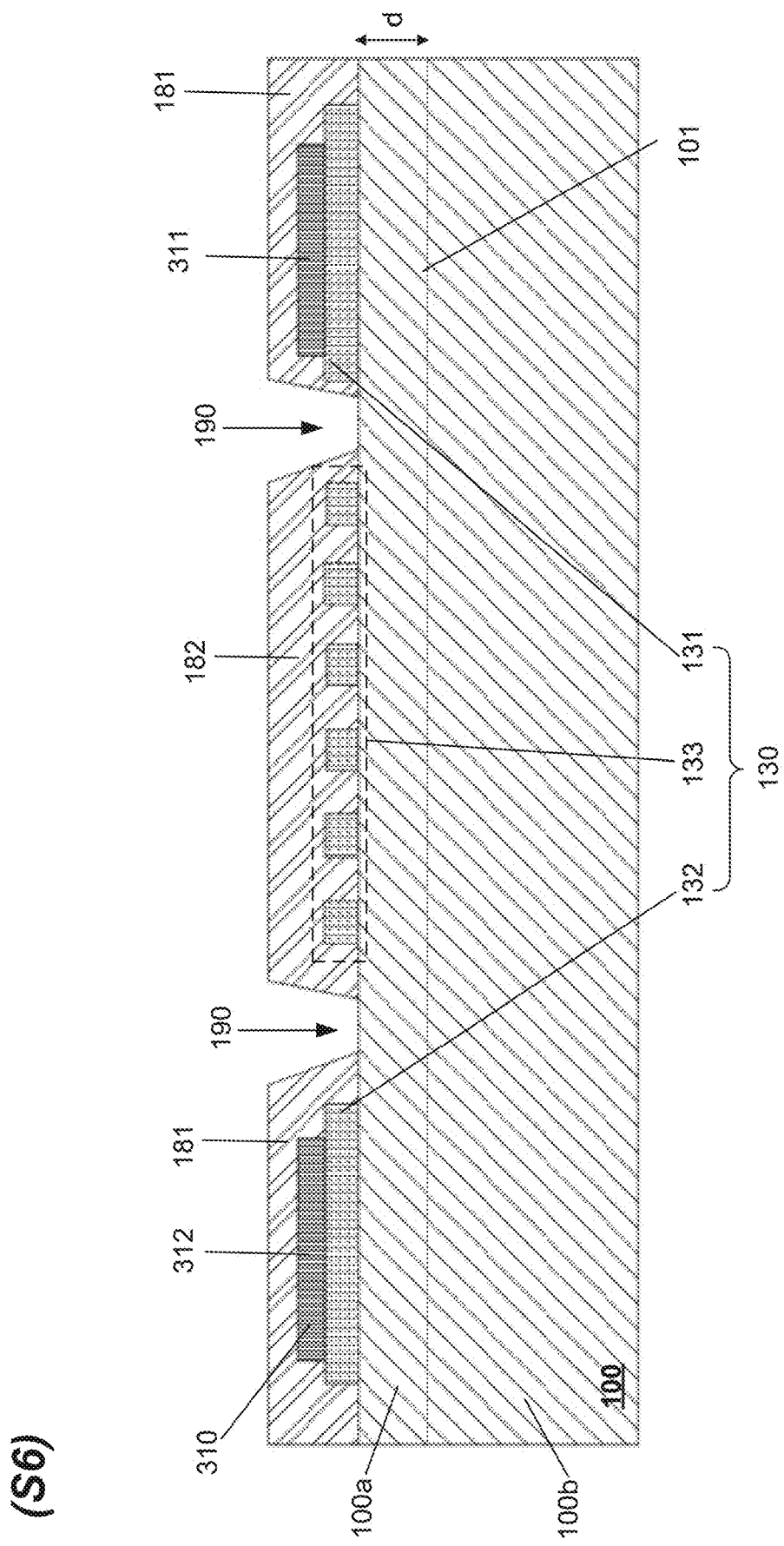

As illustrated in FIG. 3F, in step S6, first dielectric layer 180 is patterned by etching to form a trench 190 that exposes first portion 100*a* of piezoelectric substrate 100. The patterned first dielectric layer 180 includes a peripheral section 181 and an island section 182 separated from each other by trench 190. Peripheral section 181 surrounds trench 190, which surrounds island section 182. Island section 182 is vertically aligned with interdigital portion 133 of first IDT 130. Island section 182 will be removed during a subsequent etching and releasing process, thereby forming cavity 500.

Figure 3G:
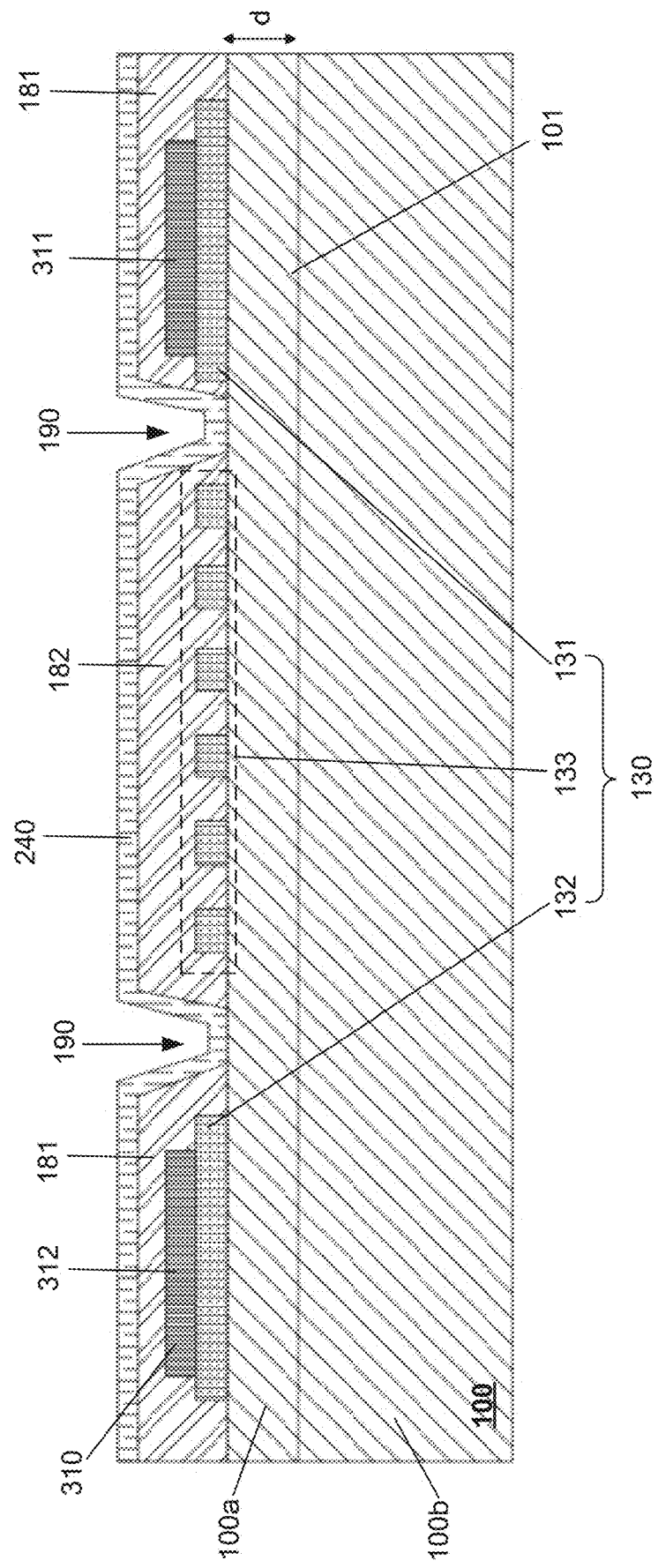

As illustrated in FIG. 3G, in step S7, second dielectric layer 240 is deposited on the structure of FIG. 3F. That is, second dielectric layer 240 is deposited on a top surface of first dielectric layer 180, side surfaces of trench 190, and the portion of first portion 100*a* of piezoelectric substrate 100 that was exposed by trench 190. As a result, island section 182 of first dielectric layer 180 is enclosed by second dielectric layer 240 and first portion 100*a* of piezoelectric substrate 100. Therefore, the subsequently formed cavity 500 is enclosed by second dielectric layer 240 and piezoelectric layer 140. Second dielectric layer 240 may be formed of a non-conductive material that cannot be etched by hydrofluoric acid, including, but not limited to, polysilicon, amorphous silicon, AlN, SiN, TaN, GaN, or a stacked combination of two or more of those materials.

Figure 3H:
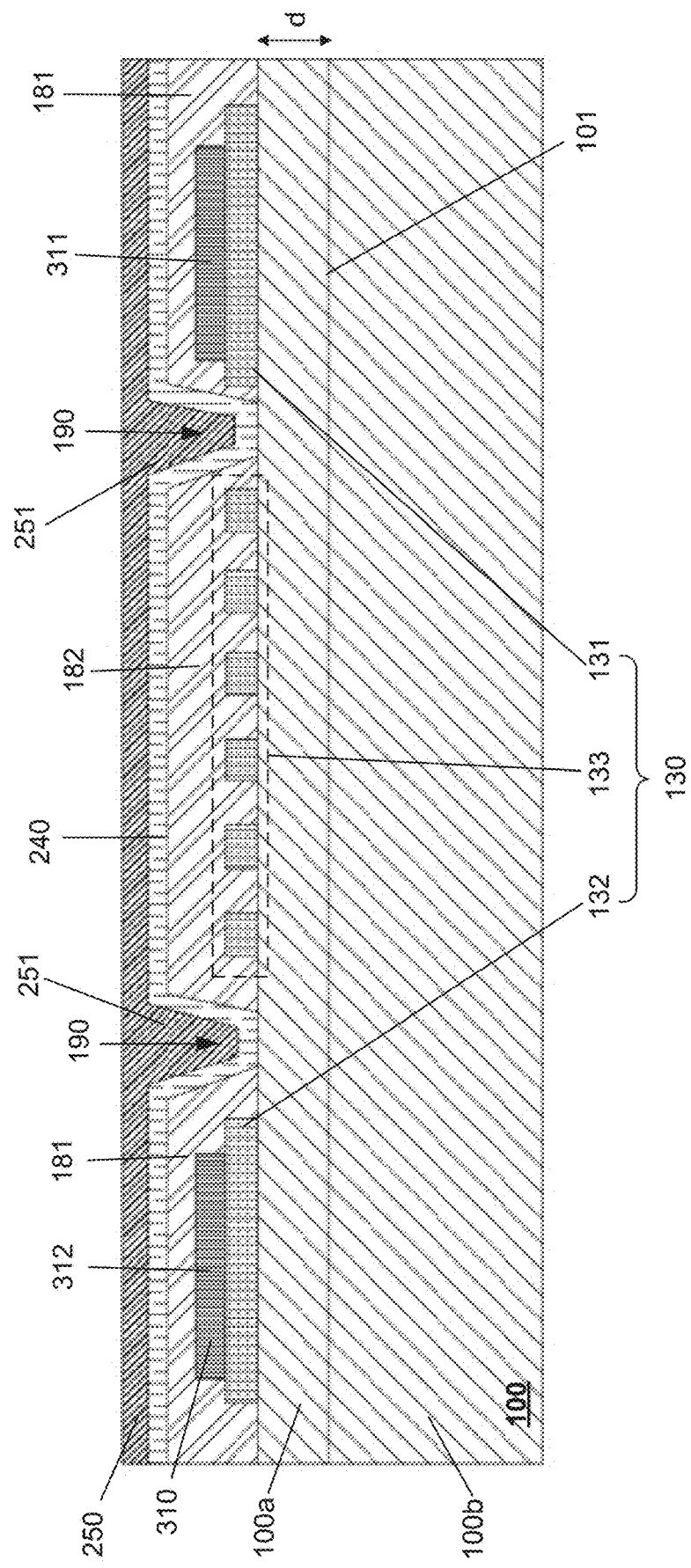

As illustrated in FIG. 3H, in step S8, third dielectric layer 250 is deposited on the structure of FIG. 3G. That is, third dielectric layer 250 is deposited on second dielectric layer 240 and filling in trench 190. The portion of third dielectric layer 250 that fills in trench 190 constitutes protruding structure 251 in SAW filter 1000. Then, a top surface of third dielectric layer 250 is polished by, for example, chemical mechanical polishing (CMP) so that the top surface of third dielectric layer 250 is parallel to a major plane of piezoelectric substrate 100. Third dielectric layer 250 may be a non-conductive material such as silicon oxide, silicon nitride, or a stacked combination thereof.

Figure 3I:
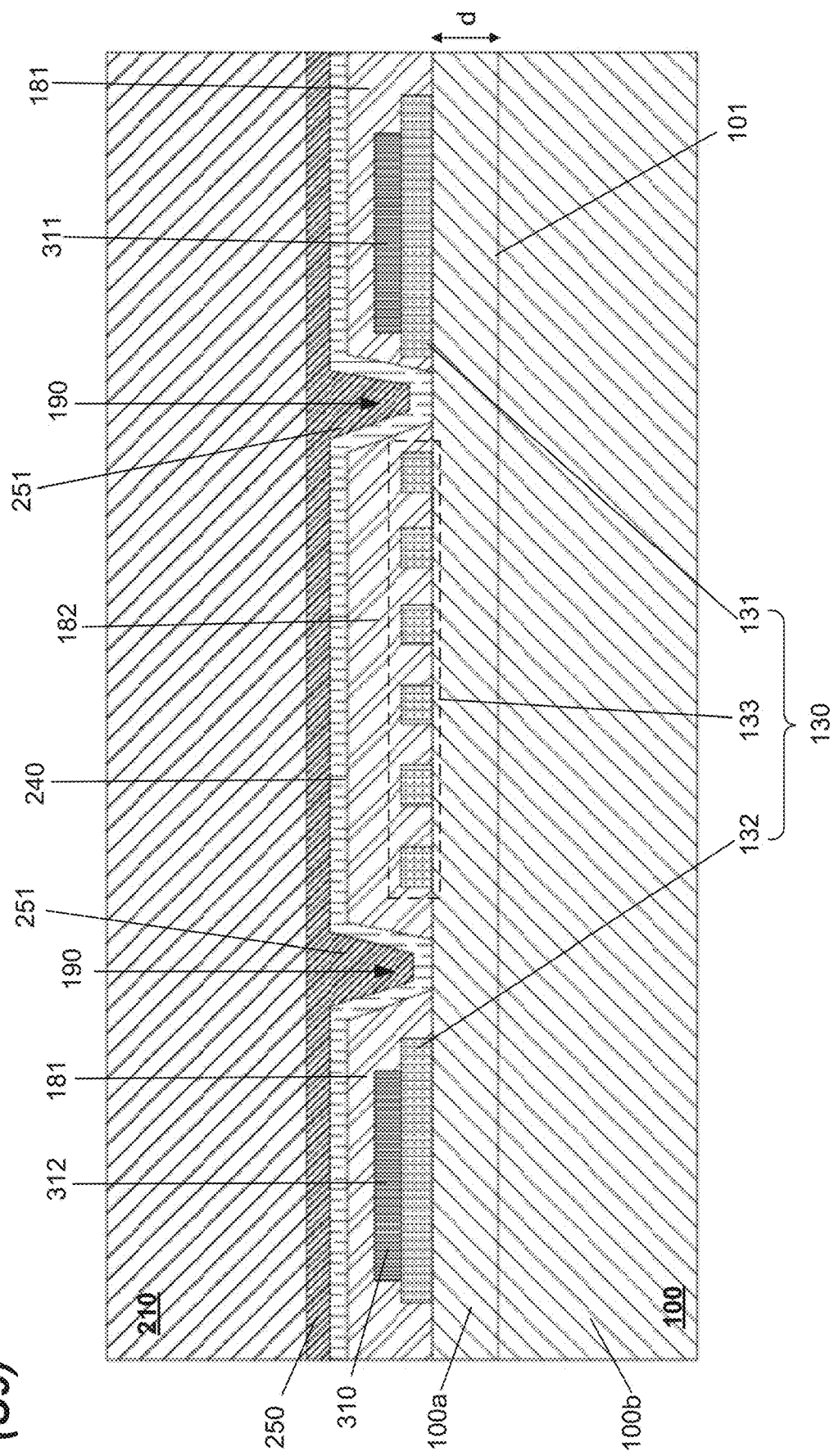

As illustrated in FIG. 3I, in step S9, bottom substrate 210 is bonded to third dielectric layer 250. Bottom substrate 210 may include Si, $SiO_2$, polysilicon, silicon carbide, sapphire ($Al_2O_3$), or a stacked combination of two or more of those materials.

Figure 3J:
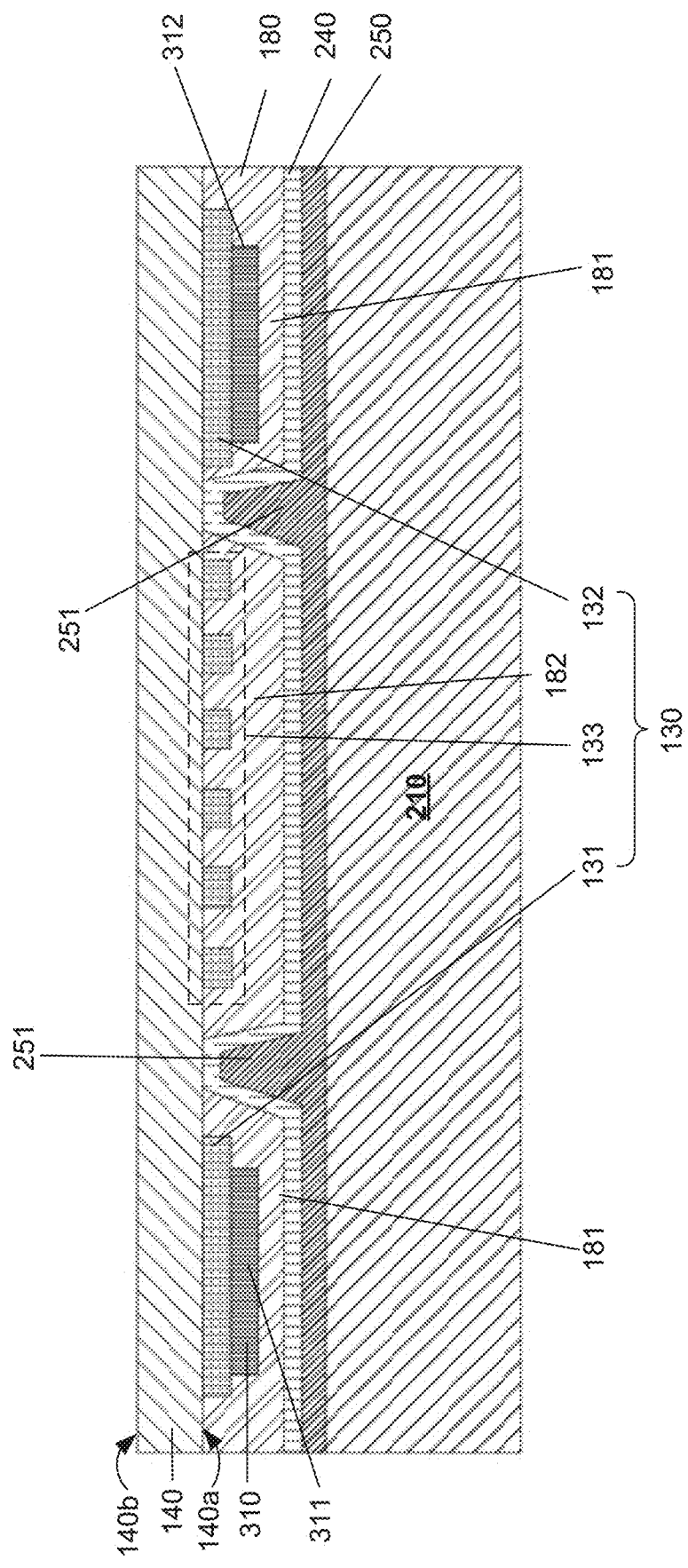

As illustrated in FIG. 3J, in step S10, the structure shown in FIG. 3I is flipped over and a thermal anneal is performed on the structure. The annealing temperature may range from approximately 400° C. to approximately 650° C. As a result of the thermal anneal, ion layer 101 in piezoelectric substrate 100 is broken. Second portion 100*b* of piezoelectric substrate 100 below ion layer 101 is removed, while first portion 100*a* of piezoelectric substrate 100 above ion layer 101 remains. First portion 100*a* of piezoelectric substrate 100 constitutes piezoelectric layer 140 in SAW filter 1000. Piezoelectric layer 140 has bottom surface 140*a* where first IDT 130 is formed, and top surface 140*b* exposed. A CMP may be performed on the exposed top surface 140*b* of piezoelectric layer 140 to obtain a smooth surface, and to achieve the desired thickness of piezoelectric layer 140 in SAW filter 1000. In some embodiments, an ion beam etching (IBE) or ion beam milling process may be performed on piezoelectric layer 140 to achieve a more uniform thickness.

Figure 3K:
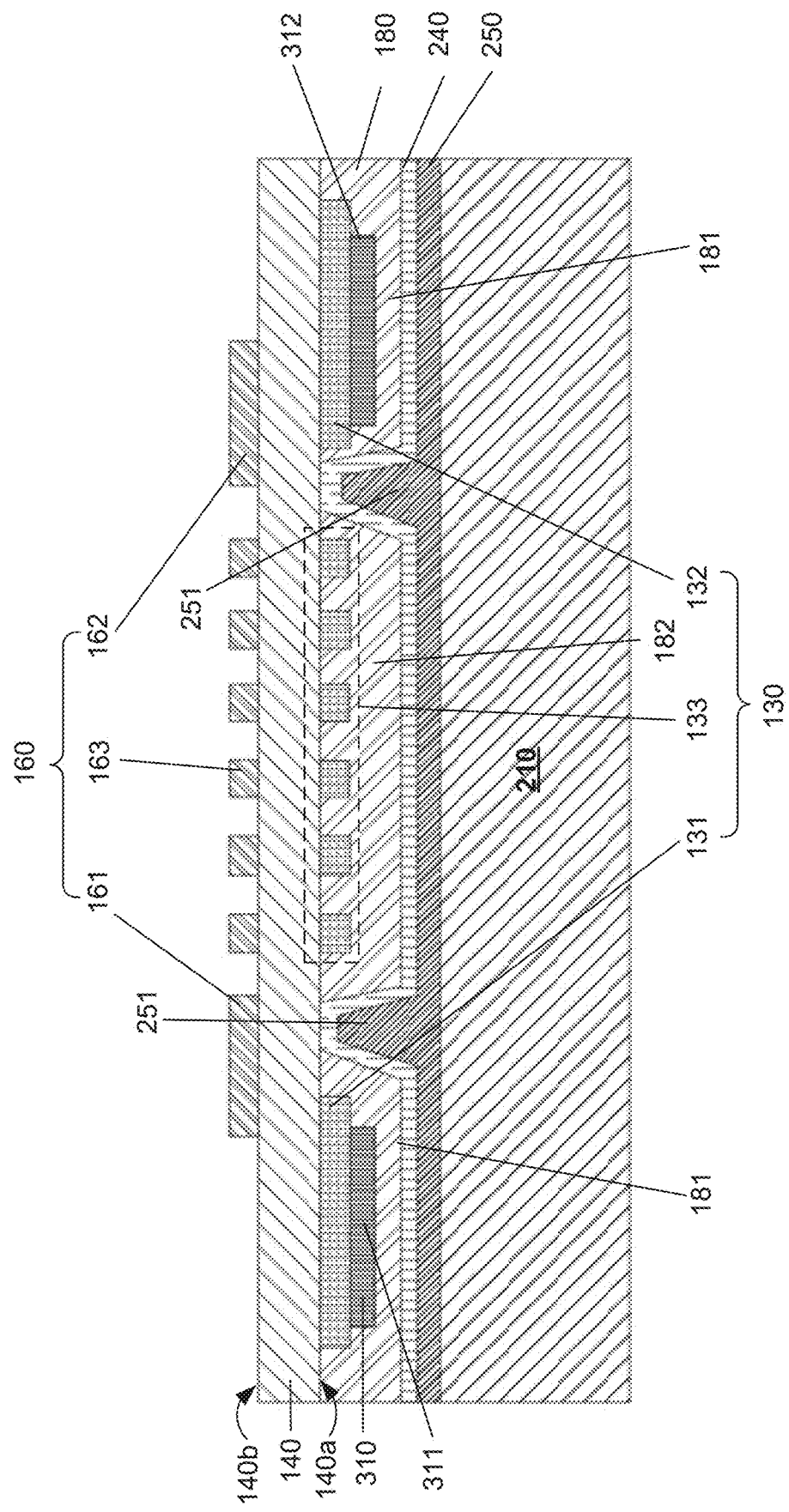

As illustrated in FIG. 3K, in step S11, second IDT 160 is formed on top surface 140*b* of piezoelectric layer 140. Second IDT 160 includes first input and output end 161, second input and output end 162, and interdigital portion 163 disposed between first and second input and output ends 161 and 162. Interdigital portion 163 of second IDT 160 is vertically aligned with interdigital portion 133 of first IDT 130.

Figure 3L:
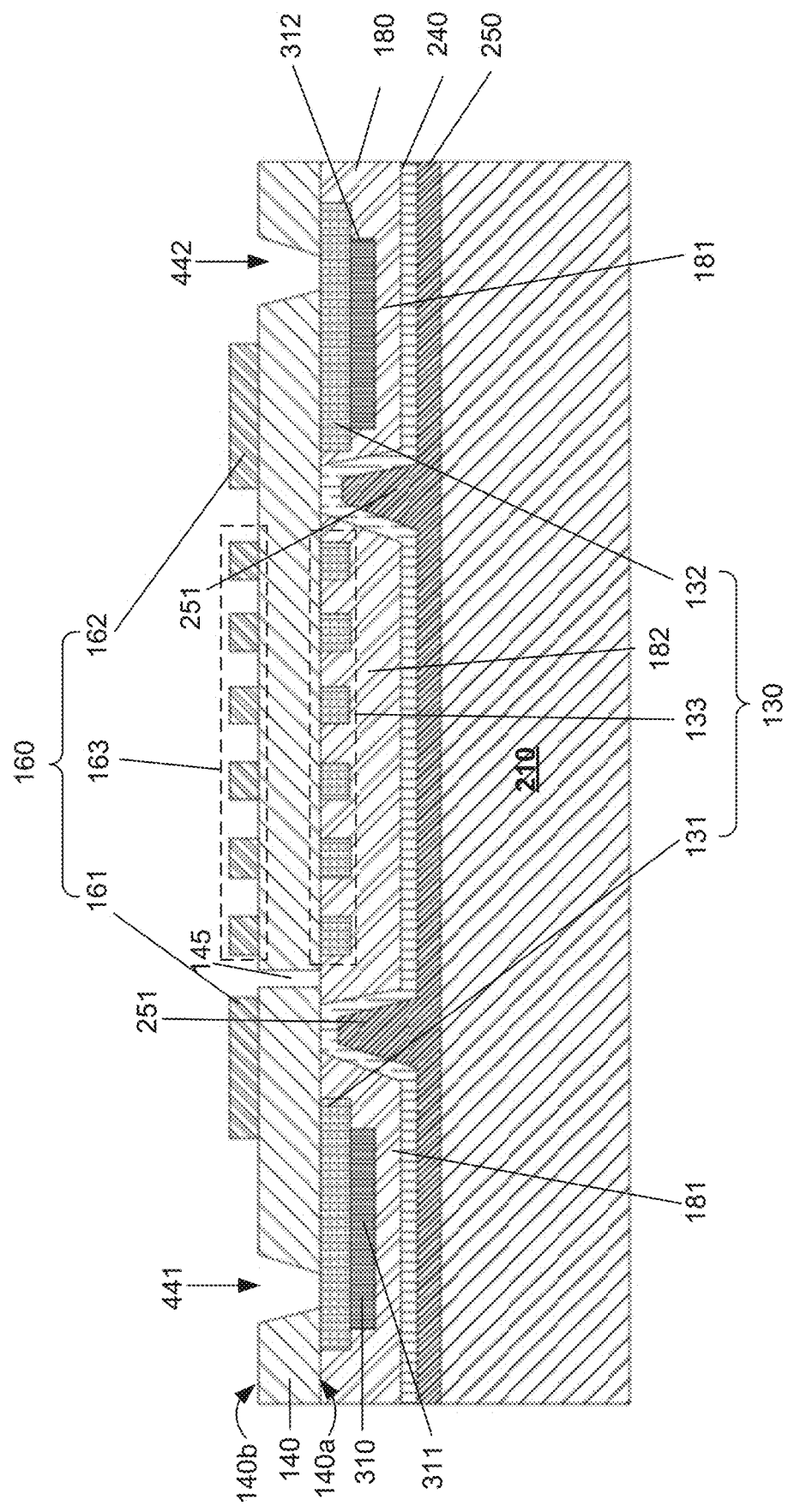

As illustrated in FIG. 3L, in step S12, piezoelectric layer 140 is etched to form a first opening 441 that exposes a portion of first input and output end 131 of first IDT 130, a second opening 442 that exposes a portion of second input and output end 132 of first IDT 130, and a release hole 145 that exposes a portion of island section 182 of first dielectric layer 180. Release hole 145 is used for forming cavity 500 in the subsequent etching and releasing process.

Figure 3M:
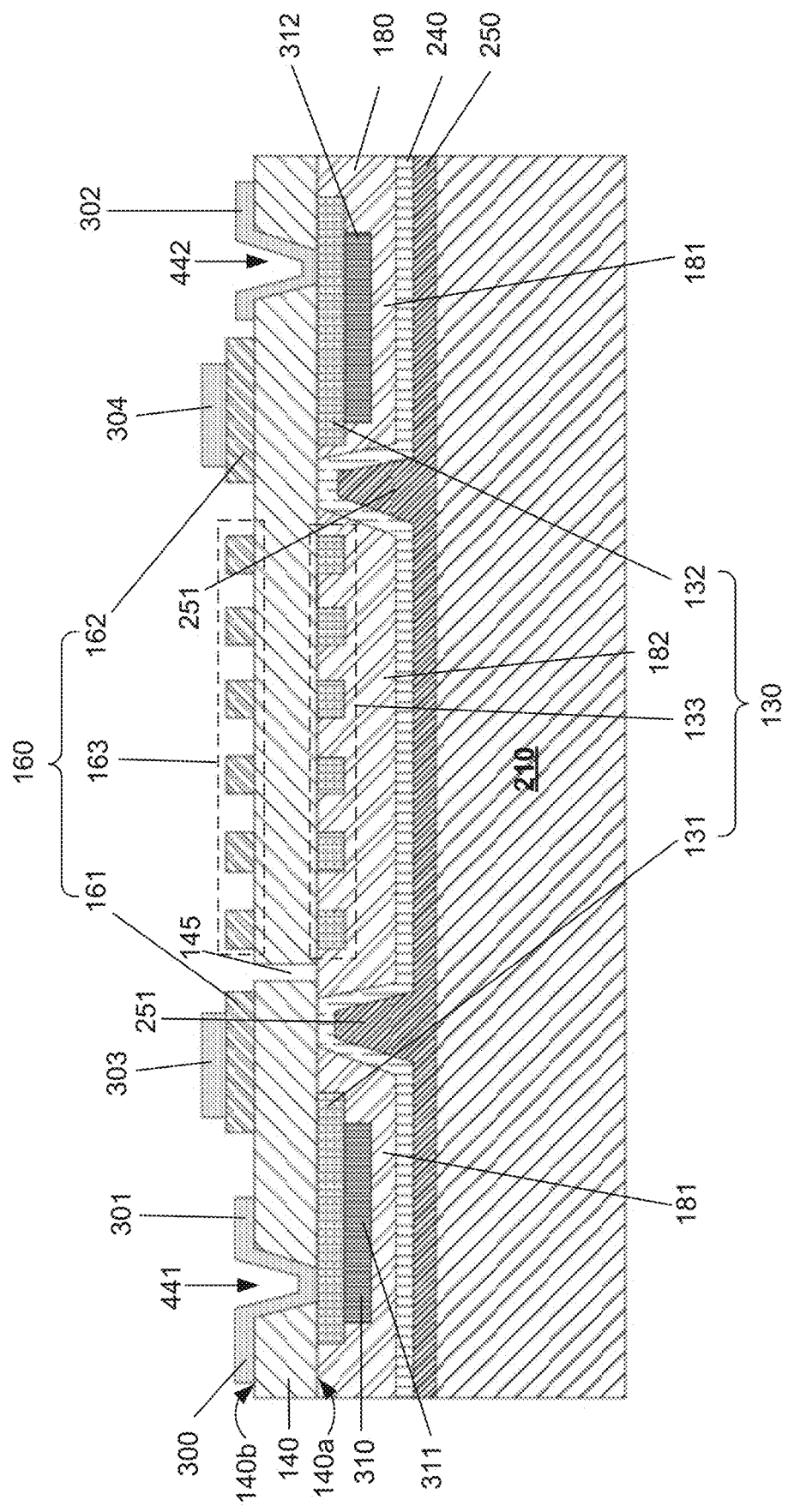
Figure 3N:
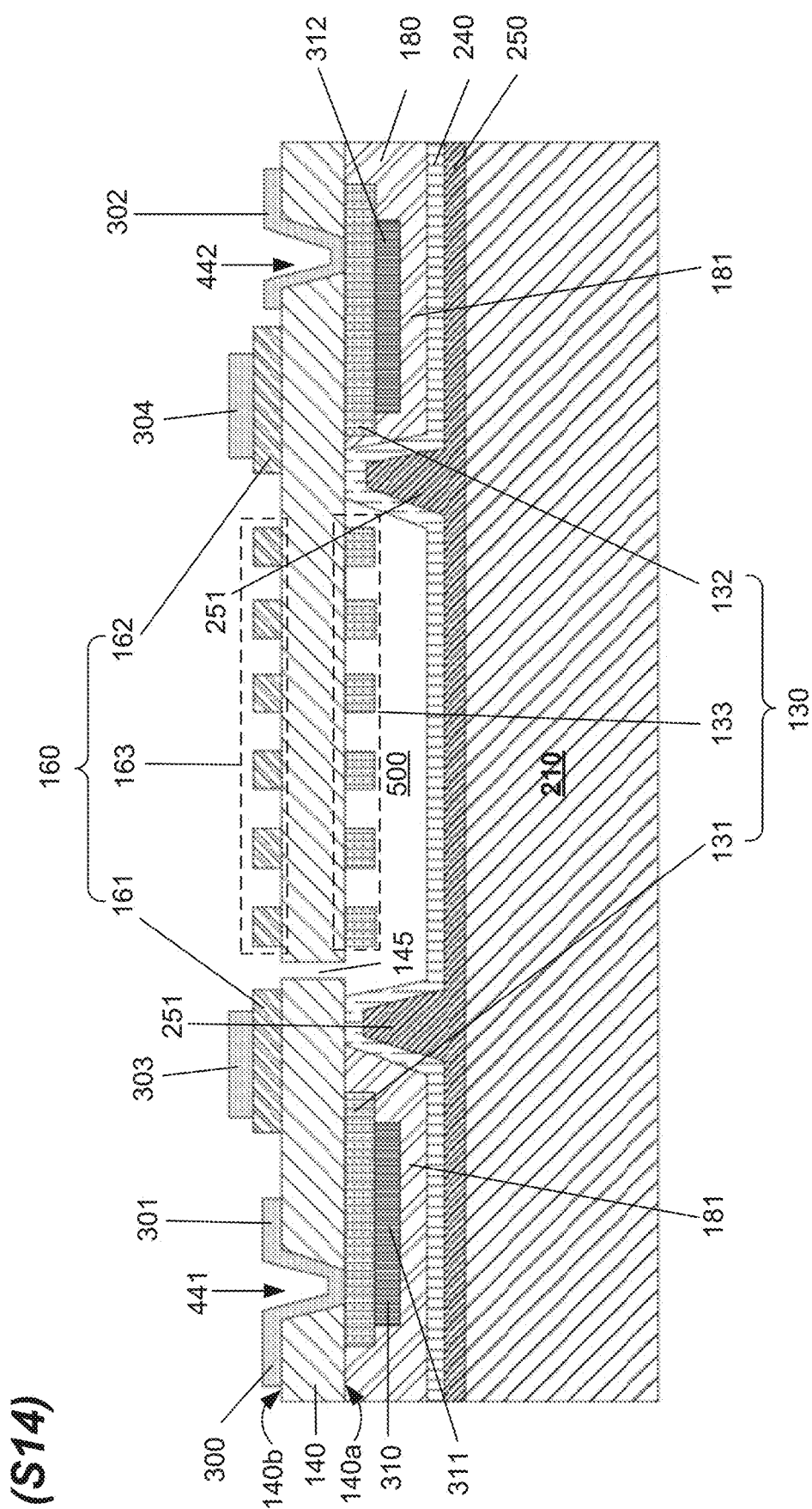

As illustrated in FIG. 3M, in step S13, a second pad metal layer 300 is formed on the structure of FIG. 3L. Then, second pad metal layer 300 is patterned to form first section 301 disposed in first opening 441 and electrically connected to first input and output end 131 of first IDT 130 via first opening 441, second section 302 disposed in second opening 442 and electrically connected to second input and output end 132 of first IDT 130 via second opening 442, third section 303 disposed above and electrically connected to first input and output end 161 of second IDT 160, and fourth section 304 disposed above and electrically connected to second input and output end 162 of second IDT 160.

As illustrated in FIG. 3N, in step S14, island section 182 of first dielectric layer 180 is etched and released via release hole 145 to form cavity 500 below interdigital portion 133 of first IDT 130. Island section 182 may be etched by a dry etch process using XeF$_2$ plasma. The etchant and etching products of the etching process may be released through the release hole formed in piezoelectric layer in step S11. Thus, SAW filter 1000 illustrated in FIG. 1A is fabricated.

Figure 4:
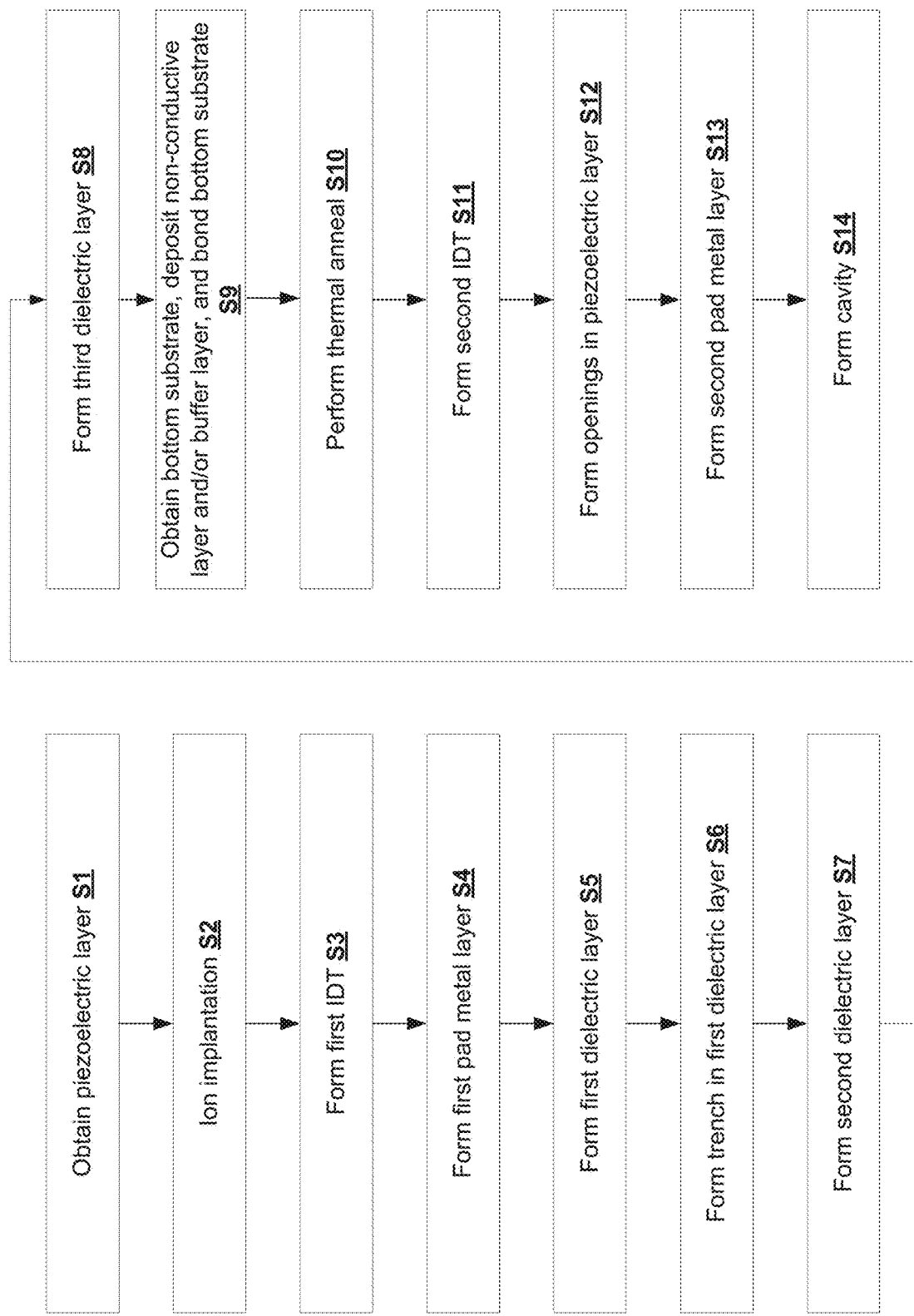
FIG. 4 is a flow chart of a process of fabricating the SAW filter of FIG. 1E, according to an embodiment of the present disclosure.

FIG. 4 is a flow chart of a process of fabricating SAW filter 1001 illustrated FIG. 1E, according to an embodiment of the present disclosure. The process of fabricating SAW filter 1001 as the process of fabricating SAW filter 1000 except that, at step S9, bottom substrate 210 is obtained, at least one of non-conductive layer 320 or buffer layer 330 are deposited on bottom substrate 210, and then bottom substrate 210 deposited with at least one of non-conductive layer 320 or buffer layer 330 is bonded to third dielectric layer 250. When both of non-conductive layer 320 and buffer layer 330 are deposited on bottom substrate 210, non-conductive layer 320 is first deposited on bottom substrate 210, and then buffer layer 330 is deposited on non-conductive layer 320.

Except for step S9, the fabrication process of SAW filter 1001 is the same as that of SAW filter 1000, and therefore detailed descriptions of the other steps of fabricating SAW filter 1001 are not repeated.

In SAW filters 1000 and 1001 according to the embodiments of the present disclosure, first IDT 130 and second IDT 160 are provided on both sides of piezoelectric layer 140. As a result, the size of the filter chips can be reduced and thus miniaturization of the filter chips can be realized. For example, some IDTs of a single frequency filter are arranged on one side of a piezoelectric layer, while other IDTs of the single frequency filter are arranged on the opposite side of the piezoelectric layer, thereby reducing the area of the filter chip. For another example, a first filter of a first frequency band is arranged on one side of the piezoelectric layer, while a second filter of a second frequency band is arranged on the opposite side of piezoelectric layer. That is, a filter device having of two frequency bands can be realized by using the same piezoelectric layer.

In addition, since first IDT 130 and second IDT 160 are provided on both sides of piezoelectric layer 140, a higher effective electromechanical coupling coefficient, also referred to as Keff2, of the resonance device can be obtained.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A fabrication method of a surface acoustic wave (SAW) filter device, comprising:
   obtaining a piezoelectric substrate;
   forming a first interdigital transducer (IDT) on a first portion of the piezoelectric substrate;
   forming a first pad metal layer on the first IDT, a first section of the first pad metal layer being formed on a first input and output end of the first IDT, and a second section of the first pad metal layer being formed on a second input and output end of the first IDT;
   forming a first dielectric layer on the first portion of the piezoelectric substrate, covering the first IDT and the first pad metal layer;
   forming a trench in the first dielectric layer and exposing a portion of the first portion of the piezoelectric substrate, the trench surrounding a portion of the first dielectric layer that covers an interdigital portion of the first IDT;
   forming a second dielectric layer on the first dielectric layer and covering sidewalls and a bottom of the trench;
   forming a third dielectric layer on the second dielectric layer, the third dielectric layer filling in the trench;
   bonding a bottom substrate to the third dielectric layer;
   removing a second portion of the piezoelectric substrate and leaving the first portion of the piezoelectric substrate, the first portion of the piezoelectric substrate constituting a piezoelectric layer;
   forming a second IDT on the piezoelectric layer;
   etching and releasing the portion of the first dielectric layer surrounded by the trench to form a cavity below the interdigital portion of the first IDT via a release hole formed in the piezoelectric layer;
   forming a first opening in the piezoelectric layer and exposing the first input and output end of the first IDT, a second opening in the piezoelectric layer and exposing the second input and output end of the first IDT, and a release hole exposing the portion of the first dielectric layer surrounded by the trench; and
   forming a second pad metal layer on the piezoelectric layer, a first section of the second pad metal layer being electrically connected to the first input and output end of the first IDT via the first opening, a second section of the second pad metal layer being electrically connected to the second input and output end of the first IDT via the second opening, a third section of the second pad metal layer being electrically connected to a first input and output end of the second IDT, and a fourth section of the second pad metal layer being electrically connected to a second input and output end of the second IDT.

2. The method of claim 1, further comprising:
   before forming the first IDT on the first portion of the piezoelectric substrate, implanting ions into the piezoelectric substrate to form an ion layer at a predetermined depth of the piezoelectric substrate, wherein the first portion of the piezoelectric substrate is disposed above the ion layer, and the second portion of the piezoelectric substrate is disposed below the ion layer; and
   after bonding the bottom substrate to the third dielectric layer, performing a thermal anneal to break the ion layer in the piezoelectric substrate, so as to remove the second portion of the piezoelectric substrate.

3. The method of claim 1, wherein the first dielectric layer is formed of silicon oxide, silicon nitride, or a stacked combination of those materials;
   the second dielectric layer is formed of polysilicon, amorphous silicon, AlN, SiN, TaN, GaN, or a stacked combination of two or more of those materials; and
   the third dielectric layer is formed of silicon oxide, silicon nitride, or a stacked combination of those materials.

4. The method of claim 1, wherein the piezoelectric substrate is a lithium niobate or lithium tantalate single crystal substrate.

5. The method of claim 1, further comprising, before bonding the bottom substrate to the third dielectric layer:
   forming a non-conductive layer on the bottom substrate.

6. The method of claim 1, further comprising, before bonding the bottom substrate to the third dielectric layer:
   forming a buffer layer on the bottom substrate.

7. The method of claim 1, further comprising, before bonding the bottom substrate to the third dielectric layer:
   forming a non-conductive layer on the bottom substrate; and
   forming a buffer layer on the non-conductive layer.

8. The method of claim 1, wherein the bottom substrate is formed of Si, $SiO_2$, polysilicon, silicon carbide, sapphire ($Al_2O_3$), or a stacked combination of two or more of those materials.

* * * * *